(12) United States Patent
Kuwabara

(10) Patent No.: US 8,058,146 B2
(45) Date of Patent: Nov. 15, 2011

(54) PEELING METHOD

(75) Inventor: Hideaki Kuwabara, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 855 days.

(21) Appl. No.: 11/662,411

(22) PCT Filed: Sep. 20, 2005

(86) PCT No.: PCT/JP2005/017905
§ 371 (c)(1),
(2), (4) Date: Mar. 9, 2007

(87) PCT Pub. No.: WO2006/033451
PCT Pub. Date: Mar. 30, 2006

(65) Prior Publication Data
US 2007/0257311 A1    Nov. 8, 2007

(30) Foreign Application Priority Data
Sep. 24, 2004    (JP) .................................. 2004-277538

(51) Int. Cl.
*H01L 21/84* (2006.01)
*H01L 25/00* (2006.01)
(52) U.S. Cl. ........ 438/458; 438/118; 438/455; 438/457; 257/684; 257/783; 257/E21.57
(58) Field of Classification Search .......... 438/106–127, 438/26–32, 34–35, 406, 455–459, 624; 257/676, 257/684, 782–783, E21.57, E23.02, E23.023, 257/E23.034, E23.04, E23.041, E23.106, 257/E23.108
See application file for complete search history.

(56) References Cited

U.S. PATENT DOCUMENTS
6,127,199 A * 10/2000 Inoue et al. ..................... 438/30
(Continued)

FOREIGN PATENT DOCUMENTS
JP    08250745 A * 9/1996
(Continued)

OTHER PUBLICATIONS
International Search Report (Application No. PCT/JP2005/017905) dated Dec. 27, 2005.
(Continued)

*Primary Examiner* — Matthew C Landau
*Assistant Examiner* — Maliheh Malek
(74) *Attorney, Agent, or Firm* — Eric J. Robinson; Robinson Intellectual Property Law Office, P.C.

(57) ABSTRACT

The present invention provides a method for manufacturing massively and efficiently a minute device which can receive or send data in contact, preferably, out of contact by forming an integrated circuit which is formed by a thin film over a large glass substrate and by peeling the integrated circuit from the substrate. Especially, an integrated circuit which is formed by a thin film is extremely thin, and so there is a threat that the integrated circuit is flied when transporting, and so handling thereof is difficult. In accordance with the present invention, a separating layer (also referred to as a peeling layer) is damaged at a plurality of times by at least two different kinds of methods (a damage due to laser light irradiation, a damage due to etching, or a damage due to a physical means), subsequently, the layer to be peeled can be efficiently peeled from a substrate. Further, handling of individual devices becomes easy by arching the peeled device.

12 Claims, 11 Drawing Sheets

U.S. PATENT DOCUMENTS

| | | | | |
|---|---|---|---|---|
| 6,740,411 | B2* | 5/2004 | Kojima et al. | 428/413 |
| 6,825,820 | B2* | 11/2004 | Yamazaki et al. | 345/76 |
| 7,030,551 | B2* | 4/2006 | Yamazaki et al. | 313/498 |
| 7,129,567 | B2* | 10/2006 | Kirby et al. | 257/621 |
| 7,487,373 | B2* | 2/2009 | Koyama | 713/323 |
| 7,564,139 | B2* | 7/2009 | Kuwabara et al. | 257/778 |
| 7,630,233 | B2* | 12/2009 | Kato et al. | 365/163 |
| 7,639,248 | B2* | 12/2009 | Yamazaki et al. | 345/211 |
| 7,707,442 | B2* | 4/2010 | Kato | 713/322 |
| 7,772,523 | B2* | 8/2010 | Tanaka et al. | 219/121.8 |
| 7,786,544 | B2* | 8/2010 | Yamazaki et al. | 257/458 |
| 2002/0018060 | A1* | 2/2002 | Yamazaki et al. | 345/211 |
| 2002/0044208 | A1* | 4/2002 | Yamazaki et al. | 348/272 |
| 2002/0058387 | A1* | 5/2002 | Ito | 438/308 |
| 2002/0068419 | A1* | 6/2002 | Sakaguchi et al. | 438/458 |
| 2003/0032210 | A1* | 2/2003 | Takayama et al. | 438/30 |
| 2003/0087503 | A1* | 5/2003 | Sakaguchi et al. | 438/406 |
| 2004/0201023 | A1* | 10/2004 | Yamazaki et al. | 257/75 |
| 2006/0273319 | A1* | 12/2006 | Dairiki et al. | 257/66 |
| 2006/0276007 | A1* | 12/2006 | Nakata et al. | 438/455 |
| 2008/0149931 | A1* | 6/2008 | Koyama | 257/59 |
| 2009/0023251 | A1* | 1/2009 | Eguchi et al. | 438/118 |
| 2011/0097834 | A1* | 4/2011 | Yamazaki et al. | 438/30 |

FOREIGN PATENT DOCUMENTS

| | | | |
|---|---|---|---|
| JP | 08288522 A | * | 11/1996 |
| JP | 10125929 A | * | 5/1998 |
| JP | 10125930 A | * | 5/1998 |
| JP | 10125931 A | * | 5/1998 |
| JP | 2001-175832 | | 6/2001 |
| JP | 2002-329181 | | 11/2002 |
| JP | 2003174153 A | * | 6/2003 |

OTHER PUBLICATIONS

Written Opinion (Application No. PCT/JP2005/017905) dated Dec. 27, 2005.

* cited by examiner

210

210

210

210

PEELING METHOD

TECHNICAL FIELD

The present invention relates to a semiconductor device having a circuit constructed by a thin film transistor (hereinafter, TFT) and a method for manufacturing the semiconductor device. For example, the present invention relates to an electric appliance which is mounted with a light-emitting display device having an electro-optical device or an organic light-emitting element as a component.

In this specification, the term "semiconductor device" refers to a device in general which can operate by utilizing semiconductor characteristics. An electro-optical device, a semiconductor circuit, and an electric appliance are semiconductor devices.

BACKGROUND ART

In recent years, a technique of constructing a thin film transistor (TFT) with a semiconductor thin film (with a thickness of approximately several to several hundreds nm) formed over a substrate having an insulating surface has attracted attention. The thin film transistor is widely used in an electronic device such as an IC or an electro-optical device, and is rushed to be developed especially as a switching element of an image display device.

Various applications using such the image display device have been expected. Especially, an application of a portable device has attracted attention. Currently, a glass substrate or a quartz substrate is often used; however, these substrates have defects of being fragile and heavy. The size of a glass substrate or a quartz substrate is difficult to be increased, and so these substrates are unsuitable for mass-production. Consequently, a TFT element is attempted to be formed over a substrate having flexibility, typically, a flexible plastic substrate.

However, the present situation is that maximum temperature of a process should be lowered since a plastic film has low heat resistance, as a result, a TFT having electric characteristics as favorable as those of the TFT formed over a glass substrate cannot be formed. Therefore, a high performance liquid crystal display device or light-emitting element using a plastic film has not been realized.

A technique of peeling an element formed over a glass substrate and transferring the peeled element to another base material, for example, a plastic film has been proposed.

This applicant proposes peeling and transferring techniques disclosed in patent documents 1 and 2. Further, this applicant proposes peeling and transferring techniques disclosed in a patent document 6.

In a minute device such as an IC, a semiconductor wafer pasted onto a pressure-sensitive adhesive sheet is cut into each chip and the cut semiconductor element is picked up from the pressure-sensitive adhesive sheet to be mounted to a circuit substrate which constructs an IC card or the like. However, the semiconductor element has defects of being easily damaged and fragile since a semiconductor wafer is used.

Further, a method for peeling a layer to be peeled formed over a substrate via a separating layer from the substrate has been already proposed. For example, patent documents 3 and 4 disclose the technique that a separating layer made from amorphous silicon (or polysilicon) is provided, hydrogen is released included in the amorphous silicon by emitting laser light through a substrate to produce space, and the substrate is separated from the separating layer. In addition, patent document 5 discloses that a liquid crystal display device is completed by pasting the layer to be peeled (which is referred to as a layer to be transferred) onto a plastic film by using the foregoing technique.

In the foregoing method, however, a substrate having a high light-transmitting property is used and energy which is sufficient to pass through the substrate to release hydrogen included in amorphous silicon is given, and so a whole surface is desirably irradiated with comparative large laser light. Accordingly, there arises a problem that the laser light damages the layer to be peeled. In the case that an element is manufactured over the separating layer in the foregoing method, hydrogen included in the separating layer is released to be reduced when heat treatment at high temperature is performed in a manufacturing process of the element. Subsequently, there is a threat that peeling cannot be sufficiently carried out even if laser light is emitted to the separating layer. Therefore, there is a problem that processes after forming the separating layer are limited in order to keep an amount of hydrogen included in the separating layer. In the foregoing patent publication, there is description that a light-shielding layer or a reflection layer is provided in order to prevent damages of a layer to be peeled, in that case, however, a transparent liquid crystal display device is difficult to be manufactured. In addition, it is difficult to peel a large layer to be peeled by the foregoing method.

Patent document 1: Unexamined patent publication No. 8-288522

Patent document 2: Unexamined patent publication No. 8-250745

Patent document 3: Unexamined patent publication No. 10-125929

Patent document 4: Unexamined patent publication No. 10-125931

Patent document 5: Unexamined patent publication No. 10-125930

Patent document 6: Unexamined patent publication No. 2003-174153

DISCLOSURE OF INVENTION

In recent years, it has been considered that a "noncontact IC tag" (also referred generally as noncontact data carrier) which can record and read out information out of contact is used for information management or physical distribution management of products or merchandise.

A semiconductor wafer which is a maternal body of a semiconductor chip used for an IC card or a noncontact IC tag is expensive, and so it is unsuitable for mass-production.

A manufacturing method of a matrix type (multiple pattern type) by which a multiple electronic component elements is mounted over a glass substrate and cut into pieces to be products has been widely used. In mass production, small devices are preferably manufactured over a large substrate.

Further, an integrated circuit which is formed by a thin film over a substrate may be cracked when the integrated circuit is peeled from the substrate.

In view of the foregoing, it is an object of the present invention to provide a method for manufacturing massively and efficiently a minute device which can receive or send data in contact, preferably, out of contact by forming an integrated circuit which is formed by a thin film over a large glass substrate and by peeling the integrated circuit from the substrate. Especially, an integrated circuit which is formed by a thin film is extremely thin, and so there is a threat that the integrated circuit is flied when transporting, so handling thereof is difficult.

In accordance with the present invention, a separating layer (also referred to as a peeling layer) is damaged at a plurality of times by at least two different kinds of methods (a damage due to laser light irradiation, a damage due to etching, or a damage due to a physical means), subsequently, the layer to be peeled can be efficiently separated (also referred to as peeled) from a substrate. By damaging at a plurality of times by using at least two different kinds of methods, a synergistic effect of peeling far easier than the case of using one peeling method is obtained. Since peeling can be far easier than the case of using one peeling method, the present invention is suitable for peeling using especially a large substrate.

One embodiment of the present invention is that a separating layer is formed over an insulating substrate, a layer to be peeled including an element is formed over the separating layer, laser light is selectively emitted to the separating layer to produce ablation to form a pathway (formed by cracks, holes, transformed portions, or the like), a first peeling process is performed, a second peeling process of etching with gas or liquid containing fluorine halide is promoted by utilizing the pathway, and a removing process of the separating layer is reduced. The pathway which is ablated becomes easily introduced with gas or liquid containing fluorine halide.

Ablation is a process by which a portion which absorbs irradiating light (a part of the separating layer) is excited photochemically or thermally and the bond of atoms or molecules at the surface or the inside is cut to be released. Mainly, the ablation is seen as a phenomenon of generating a phase change such as melting or transpiration (evaporation) of all or a part of a constituent material of the separating layer. Further, the ablated separation layer may become the state of minute foams due to the phase change, which may lead to deteriorate the bonding force.

As laser light, laser light which makes the separating layer generate gas when the separating layer is irradiated with the laser light, for example, gas laser such as excimer laser, $CO_2$ laser, or argon laser; solid laser such as glass laser, ruby laser, alexandrite laser, or Ti: sapphire laser; solid laser using crystals YAG, $YVO_4$, YLF, $YAlO_3$ doped with Nd, Tm, and Ho; or semiconductor laser is used. Alternatively, the laser light which uses any one of the foregoing and which makes the bonding force between atoms or molecules of substances for constructing the separating layer vanish or decrease is used as the laser light.

The laser oscillation may be continuous oscillation or pulse oscillation. The shape of laser beam may be a linear shape, a rectangular shape, a circular shape, or an ellipse shape. The wavelength may be a fundamental wave, a second harmonic wave, or a third harmonic wave, which can be appropriately selected by the person who implements the present invention. Laser can scan in a lengthwise direction, a crosswise direction, or an oblique direction, further, the laser can scan back and force.

In accordance with the conventional peeling method, it is desirable that laser light is emitted to a whole surface of the separating layer with laser light irradiation so that a region is entirely irradiated with laser light since peeling is performed by a peeling process at once. On the other hand, in accordance with the present invention, it is only necessary to emit laser light to a part of the separating layer at the first peeling process and to peel completely the separating layer at the second etching treatment even if emitting the laser light except a region provided with an element which is susceptible to laser light or the like.

In accordance with the conventional peeling method by etching with gas or liquid containing fluorine halide, a hole for promoting the etching is formed. However, it is problematic that a photolithography process is added to form the hole, an element cannot be provided to the region where the hole is formed in a small device, and integration becomes difficult. In the conventional peeling method by etching with gas or liquid, the layer to be peeled cannot be fixed since the layer is peeled from the substrate when the etching is completed. On the other hand, the present invention can form a pathway for promoting the etching by only emitting laser light and the layer to be peeled can be fixed by making a part of the separating layer easily remain by means of designing appropriately a region to be irradiated with laser light.

The present invention discloses a method for manufacturing a semiconductor device comprising the steps of: forming a separating layer over a first substrate; forming a layer to be peeled including a semiconductor element over the separating layer; forming a crack or a hole within a part of the separating layer or at an interface of the separating layer by emitting light to a part of the separating layer; separating the layer to be peeled from the first substrate by removing the separating layer by introducing gas or liquid which reacts with the separating layer from the crack or the hole; and transferring the layer to be peeled to the second substrate.

Further, an affected layer (oxide layer or the like) is formed by transforming (oxidation, reduction, or the like) the separating layer or a part of the separating layer, alternatively, a material which allows that a layer having a different etching rate is formed in the separating layer or a part of the separating layer. The present invention discloses a method for manufacturing a semiconductor device comprising the steps of: forming a separating layer over a first substrate; forming a layer to be peeled including a semiconductor element over the separating layer; transforming a part of the separating layer by emitting light to the part of the separating layer; separating the layer to be peeled from the first substrate by removing the separating layer by introducing gas or liquid which reacts with the separating layer from the part of the separating layer which is transformed; and transferring the layer to be peeled to a second substrate.

The present invention discloses that a separating layer is formed over an insulating substrate, a layer to be peeled including an element is formed over the separating layer, the separating layer is selectively removed by etching with gas or liquid containing fluorine halide as first peeling process and fixed by leaving a part of the separating layer, and the layer to be peeled can be peeled by performing ablation by laser light irradiation as a second peeling process.

The present invention discloses a method for manufacturing a semiconductor device comprising the steps of: forming a separating layer over a first substrate; forming a layer to be peeled including a semiconductor element over the separating layer; removing the separating layer with leaving a part of the separating layer by exposing the separating layer to gas or liquid which reacts with the separating layer; separating the first substrate from the layer to be peeled by emitting light to a part of the separating layer; and transferring the layer to be peeled to a second substrate.

Laser light can be emitted to the reverse side of the substrate. A device which is peeled from the substrate can be dropped from the substrate by turning the substrate and emitting laser light to the reverse side of the substrate.

The present invention discloses a method for manufacturing a semiconductor device comprising the steps of: forming a separating layer over a first substrate; forming a layer to be peeled including a semiconductor element over the separating layer; forming a crack or a hole within a part of the separating layer or at an interface of the separating layer by emitting light to a periphery of the semiconductor element; peeling the layer to be peeled layer from the first substrate which are fixed to each other by a part of the separating layer overlapped with the semiconductor element; and transferring the layer to be peeled to a second substrate.

In accordance with the present invention, as the first peeling process, laser light is emitted to the separating layer, and a pathway (formed by a crack, a hole, an ablated portion, or the like) is formed by producing ablation in the separating layer irradiated with laser light after the separating layer is formed over an insulating substrate and a layer to be peeled including an element is formed over the separating layer. Thereafter, a part surrounded by the pathway is peeled by a physical means.

The present invention discloses a method for manufacturing a semiconductor device comprising the steps of: forming a separating layer over a first substrate; forming a layer to be peeled including a semiconductor element over the separating layer; forming a crack or a hole within a part of the separating layer or at an interface of the separating layer by emitting light to a periphery of the semiconductor element; peeling the layer to be peeled layer from the first substrate which are fixed to each other by a part of the separating layer overlapped with the semiconductor element; and transferring the layer to be peeled to a second substrate.

In the foregoing structure, the separating layer is formed by a film containing $WO_X$ over W, a film containing $MoO_X$ over Mo, a film containing $NbO_X$ over Nb, or a film containing $TiO_X$ over Ti.

A part which is easy to be held with a chuck claw or the like is preferably provided. One corner among four corners of a substrate provided with a layer to be peeled over a separating layer is turned up by laser light irradiation to form a portion which is easy to be held, and the portion is pulled in the direction of another corner with a chuck claw by a physical means. The layer to be peeled is peeled to the oblique direction to the side of the substrate.

In accordance with the present invention, as the first peeling process, laser light is emitted to the separating layer, and a pathway (formed by a crack, a hole, an ablated portion, or the like) is formed by producing ablation in the separating layer irradiated with laser light after the separating layer is formed over an insulating substrate and a layer to be peeled including an element is formed over the separating layer. Thereafter, as the second peeling process, in order to peel only one corner, a part of the separating layer is removed to turn up purposely one corner of the layer to be peeled. By doing this, a part which is easy to be held can be provided. Then, as the third peeling process, one peeled corner is peeled by a physical means to peel a part surrounded by the pathway. In that case, different three kinds of methods are used for the peeling.

As a material for the separating layer, a material which can decompose or dissolve in gas or liquid used in a peeling process is used. As the separating layer, a layer which absorbs irradiating light (laser light, light from a halogen lamp, or the like) and which is peeled within the layer or at the interface (also referred to as peeling within a film or peeling at an interface hereinafter), preferably, a layer in which the bonding force between atoms or molecules of a substance for constructing the separating layer vanishes or decreases or which is peeled within the layer or at the interface is used. Further, an affected layer (oxide layer or the like) is formed by transforming (oxidation, reduction, or the like) the separating layer or a part of the separating layer, alternatively, a material which allows that a layer having a different etching rate is formed in the separating layer or a part of the separating layer.

Gas may be released from the separating layer and separating effects may be expressed due to light irradiation. That is, there is a case that a constituent included in the separating layer is released as gas or the separating layer becomes gas by absorbing light in an instant and the vapor is released to contribute to separation.

As composition of such the separating layer, the following can be nominated for example.

As an example of composition of the separating layer, a semiconductor material, typically, amorphous silicon can be nominated. The amorphous silicon can be etched by gas containing fluorine halide (for example, mixed gas of chlorine trifluoride ($ClF_3$), $ClF_4$, and $O_2$) or liquid containing fluorine halide (for example, KOH, TMAH, or the like). Also, the amorphous silicon can be force of peeling thin films which interpose the separating layer in the case that a given quantity of hydrogen is included in the amorphous silicon and inner pressure is generated. An amount of hydrogen in the amorphous silicon can be appropriately adjusted by controlling a deposition condition such as gas composition, gas pressure, gas atmosphere, gas flow, temperature, substrate temperature, or injection power.

As another example of composition of the separating layer, an element such as tungsten, molybdenum, niobium, or titanium, or an alloy containing any one kind of the foregoing can be nominated. Among all, tungsten can be etched by gas containing fluorine halide (for example, chlorine trifluoride ($ClF_3$)) and tungsten oxide ($WO_X$) formed by being transformed its surface (oxidized, here) becomes easier to be etched than tungsten. Further, thin films which interpose the separating layer can be peeled by changing adhesion due to light irradiation. In order to form tungsten oxide, it is preferable that a material layer containing oxide (silicon oxide or the like) is formed so as to be in contact with a tungsten film to emit light.

As more another example of composition of the separating layer, various oxide ceramics such as silicon oxide or silicic acid compound, titanium oxide or titanic acid compound, zirconium oxide or zirconic acid compound, or lanthanum oxide or lanthanum acid compound can be nominated. As the silicon oxide, SiO, $SiO_2$, $Si_3O_2O_3$, $Li_2SiO_3$, $CaSiO_3$, $ZrSiO_4$, and $Na_2SiO_3$ can be nominated. As the titanium oxide, TiO, $Ti_2O_3$, and $TiO_2$ can be nominated. As the titanic acid compound, $BaTiO_4$, $BaTiO_3$, $Ba_2Ti_9O_{20}$, $BaTi_5O_{11}$, $CaTiO_3$, $SrTiO_3$, $PbTiO_3$, $MgTiO_3$, $ZrTiO_2$, $SnTiO_4$, $Al_2TiO_5$, and $FeTiO_3$ can be nominated. As the zirconium oxide, $ZrO_2$ can be nominated. As the zirconic acid, $Ba_2ZrO_3$, $ZrSiO_4$, $PbZrO_3$, $MgZrO_3$, and $K_2ZrO_3$ can be nominated. As the ceramics, PET, PLZT, PLLZT, PBZT, or the like, or nitride ceramics such as silicon nitride, aluminum nitride, or titanium nitride can be nominated.

As further more another example of composition of the separating layer, an organic polymer material can be nominated. As the organic polymer material, any material can be used as long as it has the bond such as $—CH_2—$, —CO— (ketone), —CONH— (amid), —NH— (imide), —COO— (ester), —N=N— (azo), or —CH=N— (schiff) (these bonds are cut by irradiation by irradiating light 7), especially, is has many of the bonds. The organic polymer material may have aromatic hydrocarbon (1 or 2 or more of a benzene ring or the condensed ring) in the structural formula.

As a specific example of the organic polymer material, polyethylene, polyolefin such as polypropylene, polyimide, polyamide, polyester, polymethyl methacrylate (PMMA), polyphenylene sulfide (PPS), polyether sulfone (PES), or epoxy resin.

The thickness of the separating layer is depending on the conditions such as the object of peeling, the composition of the separating layer, a layer structure, or a formation method. Generally, the separating layer has a thickness of approximately 1 to 10 μm. When the thickness of the separating layer is two small, uniformity of deposition may be deteriorated and peeling may be unevenly. When the thickness of the separating layer is two large, power of irradiating light (an amount of light) is desirably increased in order to secure a favorable peeling property of the separating layer. The thickness of the separating layer is preferably even as much as possible.

A method for forming the separating layer is not especially limited and is appropriately selected in accordance with conditions such as film composition or a film thickness. For example, various vapor deposition methods such as CVD (including LPCVD, ECR-CVD, MOCVD), deposition, molecular beam evaporation (MB), sputtering, ion plating, or PVD, a coating method such as electroless deposition, Langmuir Blodgett (LB), spin coating, spray coating, or roll coating, various printing methods, an ink jetting method, a powder jetting method, or the like can be nominated. Two or more combined methods of these methods can be used.

The layer to be peeled peeled from the substrate by a peeling process is arched to be away from the edge due to stress relationship. In order to put back the arch, there is a threat that the layer to be peeled may be cracked by applying force thereto. Therefore, a film having the same direction of an arch as that of the layer to be peeled is used as a transcriptional body in accordance with the present invention to control the arch within a certain range. That is, the obtained semiconductor device is largely arched since it is in an initial state.

The structure of a semiconductor device at least a part of which is arched is one of an embodiment of the present invention. The structure is a semiconductor device having a laminate layer composed of a layer including an antenna and a layer including a thin film transistor. At least a part of the semiconductor device is arched to make the layer including an antenna be inside.

By forming the semiconductor device to have an arching shape since it is in an initial state, it becomes clear which surface of the device is an obverse side or a reverse side. In the case that the device is made to be arched in the direction opposite to that in the initial state, the surface which is fragile can become easy to know. By arching the semiconductor device at the initial state, an extremely thin device on a plane surface can become easy to be picked up.

In the foregoing structure, the layer to be peeled including an element is fixed by a film after uniaxial drawing in order to arch the semiconductor device at the initial state. The layer to be peeled can be fixed by at least one film. The layer to be peeled including an element may be fixed by being interposed between two films which are adjusted their drawing directions (films after uniaxial drawing) to be sealed.

Alternatively, the semiconductor device may be arched at its initial state by interposing between a plurality of films having different coefficients of thermal expansion.

Further alternatively, in the foregoing structure, the semiconductor device may be interposed between a first film and a second film, and the thermal shrinkage of the second film provided at the side of the layer including a thin film transistor may be small than that of the first film provided at the side of the layer including an antenna.

A part of the device can be arched by arching a laminate film when performing a laminate process.

As used herein, the term "laminate film" refers to a laminate film composed of a base film and an adhesion synthetic resin film or a laminate film composed of two or more kinds of films. As the base film, polyester such as PET or PBT, nylon 6, polyamide such as nylon 66, an inorganic deposited film, or papers. As the adhesion synthetic resin film, polyolefin such as PE or PP, acrylic synthetic resin, epoxy synthetic resin, or the like can be used. The laminate film is stacked to a subject body by thermocompressing with a laminate device. As pretreatment for the laminate process, an anchor coat agent is preferably coated, which can lead to increase adhesion force between the laminate film and the subject body. As the anchor coat agent, isocyanate agent or the like can be used.

The term "heat seal" refers to sealing by thermocompression of an adhesion layer part coated to a film base or sealing by thermocompression of an outermost layer or an inner most layer having a low melting point is heated to melt and adhere by applying pressure.

Another embodiment of the present invention is a semiconductor device having a laminate layer composed of a layer including an antenna and a layer including a thin film transistor. The semiconductor device is arched to make the layer including an antenna be inside. The degree of an arch is preferably more than 0, 1% or more, and 20% or less against the width of the semiconductor device. In the case that the degree of an arch goes over 20%, there are threats that electrical characteristics of a TFT are largely changed and that an integrated circuit of the semiconductor device becomes not operated. Further, the semiconductor device in accordance with the present invention is not limited to the laminate layer composed of the layer including an antenna and the layer including a thin film transistor. The semiconductor device can be formed to have any structure if it has an antenna and an integrated circuit having a semiconductor element.

The degree of the arch is indicated by a level (b−a) measured by a depth of focus method. That is, as shown in FIG. 3C, an arched device (fixed by a film) is put on a focusing means 1202 provided with a microscope which can measure a focal length so that both edges of the device are in contact with the focusing means 1202. Accordingly, the distance to the highest position; a focal length (a) is measured, and the difference between the focal length (a) and the distance to a top surface of a measurement mold platen 1200; a focal length (b) is obtained. The obtained difference is defined as the degree of an arch.

In the case that the device has a rectangular shape, one side of the device is the width in an X direction, and another side of the device is the width of a Y direction, there may be two states as shown in FIG. 3A or 3B. A device 1201 having an arch in the direction of a short side is illustrated in FIG. 3A, whereas a device 1211 having an arch in the direction of a long side is illustrated in FIG. 3B. In either state, the device is designed to make the antenna side be inside, and the degree of an arch is more than 0, 1% or more, and 20% or less against the width of the semiconductor device (the width in the X direction or Y direction). In this specification, it is the principle that the arch is made so that the antenna side is inside; however, a part of the device may be arched so that the antenna side is outside as long as another part of the device is arched so that the antenna side is inside.

In the foregoing structure, the thin film transistor constructs a central processing unit or a thin film integrated circuit having a memory.

It is desirable that all of channel length directions in a region serving as a channel of an element which constructs the thin film integrated circuit are provided in the same directions to make the device be arched in the directions different from the channel length directions, in other words, in the channel width directions which are perpendicular to the channel length directions. FIG. 10A shows one example of the device. FIG. 10A is a perspective view for showing a device 1001 mounted over a plane surface of a mold platen 1000. The device 1001 is arched in a channel width direction 1008 of a TFT which is provided to an integrated circuit unit 1004. To explain clearly, FIG. 10A shows an island semiconductor layer 1002 of the TFT and also shows a channel length direction 1007 perpendicular to the channel width direction. FIG. 10B is a cross-sectional view corresponding to FIG. 10A. Since the channel length directions are different from the arch direction of the device, the effect on the element characteristics can be minimized. That is, a semiconductor device which has strong force against transformation in a certain direction (the arch direction of the device, here) can be provided. In addition, a semiconductor device which is hardly transformed in the direction other than a certain direction (the direction in which the device is arched, here) can be provided.

FIG. 10A shows that an antenna included in the device is formed to have a coiled shape; however, the shape of the antenna is not especially limited as long as it has a length which is sufficient to serve as an antenna. Further, in FIG. 10A, the device 1001 is arched in a parallel direction 1005 with a horizontal direction of an antenna unit 1003. The antenna unit 1003 has a threat of having breaking or the like in the case that the antenna unit 1003 is curved in various directions. Therefore, the antenna unit 1003 is preferably formed to have a shape which makes nothing of arching in a certain direction (the direction in which the device is arched, here). For example, the device 1001 can be reinforced by making thicker the size of a portion of a horizontal direction 1006 of the antenna than that of the longitudinal direction 1005 of the antenna. As shown in FIG. 10A, the shape of the antenna in the longitudinal direction is preferably made into a linear shape. By forming the antenna shape in the longitudinal direction into the linear shape, a semiconductor device which is resistant to transformation can be provided.

It is not especially limited the direction in which the device including the antenna and the integrated circuit. If the device is rectangular, the device may be arched in a diagonal direction or a part of the device may be arched in a certain predetermined direction. As a different example from that in FIG. 10A, FIG. 10C is illustrated.

FIG. 10C is a perspective view for showing a device 1101 mounted over a plane surface of a mold platen 1100. The device 1101 is arched in a channel width direction 1108 of a TFT provided at an integrated circuit unit 1104. To explain clearly, FIG. 10A shows an island semiconductor layer 1102 of a TFT and also shows a channel length direction 1107 perpendicular to the channel width direction. FIG. 10D is a cross-sectional view corresponding to FIG. 10C. In FIG. 10C, the device 1101 is arched in a parallel direction 1105 with the longitudinal direction of an antenna unit 1103. In FIG. 10C, in order to form the antenna having a shape which makes nothing of arching in a certain direction (the direction in which the device is arched, here), a portion of a longitudinal direction 1105 of the antenna is made thicker than that of the horizontal direction 1106 of the antenna.

There is a threat that a device including an antenna and an integrated circuit formed over a flexible substrate has breaking or contact failure in the case that the device is arched in various directions. The state of arching is preliminarily set as the initial state of a device, accordingly, a device can be made hardly be arched in another direction in accordance with the present invention. A strong device can be realized by doing the design of a device such as a form or arrangement of an antenna or arrangement of a TFT with taking into consideration of the initial state which is the state of the device being arched. The whole device may be formed to have the structure which can be kept easily the state of being arched in a predetermined direction by using the form or the arrangement of the antenna or the arrangement of the TFT.

In the foregoing structures, a thin film integrated circuit having the thin film transistor is driven by a communicating means from a reader/writer device in the semiconductor device.

The present invention can be applied irrespective of a TFT structure. For example, a top gate TFT, a bottom gate (reverse staggered) TFT, or a forward staggered TFT can be used. It is not limited to a single gate TFT. A multi-gate TFT having a plurality of channel formation regions, for example, a double gate TFT can be used.

As an active layer of the TFT, an amorphous semiconductor film, a semiconductor film including a crystalline structure, a compound semiconductor film including an amorphous structure or the like can be appropriately used. Moreover, as the active layer of the TFT, a semiamorphous semiconductor film (also referred to as a microcrystalline semiconductor film), which has an intermediate structure between an amorphous structure and a crystalline structure (including single crystals and poly crystals), a stable third state with respect to free energy, and a crystalline region having a short-range order and lattice distortion can be used.

In accordance with the present invention, the layer to be peeled can be efficiently peeled from the substrate by a plurality of peeling processes.

In accordance with the present invention, a device on a plane surface can become easy to be picked up by controlling the arch of the device at its initial state.

BEST MODE FOR CARRYING OUT THE INVENTION

Hereinafter, embodiments of the present invention will be explained.

Embodiment 1

A method for manufacturing the semiconductor device in accordance with the present invention is explained hereinafter.

A separating layer 11a is formed over a substrate having an insulating surface 10. A substrate having an insulating surface 10 corresponds to a glass substrate, a quartz substrate, a plastic substrate, a resin substrate made from synthetic resin having flexibility such as acrylic, or a metal substrate. The separating layer 11a is formed by a layer containing silicon by a known method such as a sputtering method or a plasma CVD method. The layer containing silicon corresponds to an amorphous semiconductor layer, a semiamorphous semiconductor layer in which an amorphous state and a crystalline state are mixed, or a crystalline semiconductor layer.

Figure 1A:
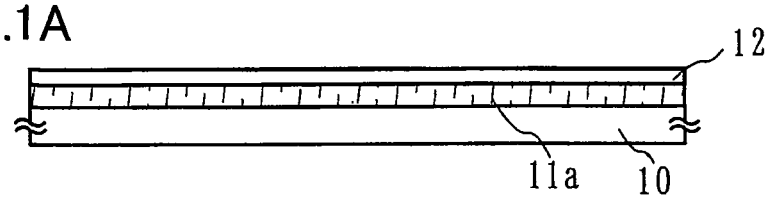
FIGS. 1A to 1E are explanatory cross-sectional views and an explanatory top view for showing a method for manufacturing a thin film integrated circuit in accordance with the present invention (Embodiment 1)

A base insulating layer 12 is formed by an inorganic insulating film. As the base insulating layer 12, a single layer film made from silicon oxide, silicon nitride, silicon oxynitride, silicon nitride oxide, or the like; or a laminated layer film of the foregoing single layer film by a known method such as a sputtering method or a plasma CVD method (refer to FIG. 1A). As a material for the base insulating layer 12, a material which hardly reacts or does not react chemically with gas or liquid containing fluorine halide used in the subsequent process is preferably used. For example, a silicon nitride film, a silicon oxide film, or a silicon oxynitride film is formed.

Figure 1B:
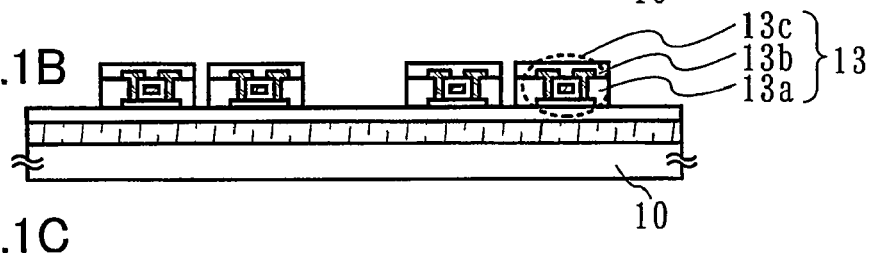

A layer to be peeled 13 using an insulating film 12a as a base film is formed (refer to FIG. 1B). In FIG. 1B, an example of showing a layer to be peeled including a first element group and a layer to be peeled including a second element group adjacent to the layer to be peeled including the first element group is illustrated. However, the present invention is not limited thereto. The substrate having an insulating surface 10 is provided with a multiple element groups and finally divided into individual pieces to be products. The layer to be peeled 13 includes a first interlayer insulating layer 13a, a second interlayer insulating layer 13b, a plurality of TFTs 13c, and a conductive layer serving as an antenna. The layer to be peeled 13 including the first element group becomes finally one device.

A protective layer may be formed over the layer to be peeled 13 by a screen printing method or a droplet discharging method. As a material for the protective layer, a material which does not react chemically with gas or liquid containing fluorine halide used in the subsequent process is preferably used. For example, organic resin such as epoxy resin may be used as the protective layer.

Figure 1C:
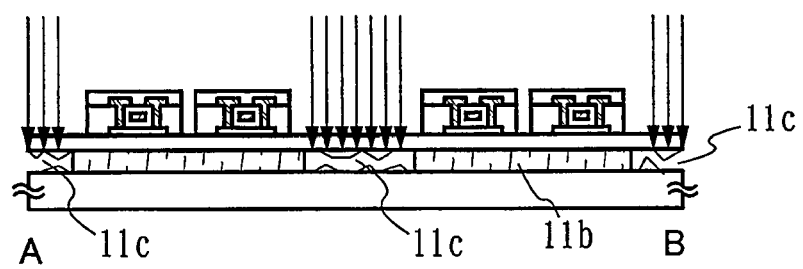
Figure 1D:
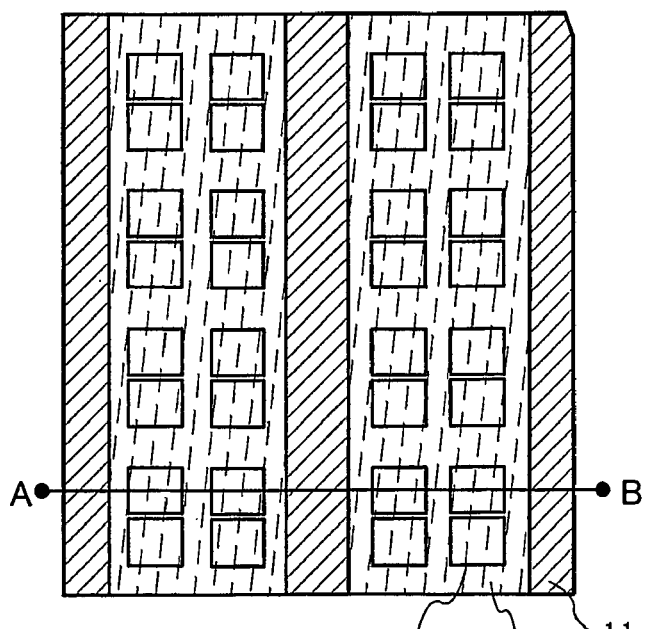

Then, a part of the separating layer is transformed or preferably ablated by emitting light selectively to perform the first step in a peeling process (FIG. 1C). After the first step in the peeling process, the layer to be peeled is fixed to the substrate by the separating layer in a region which is not irradiated with light. Light is emitted to at least the periphery of the substrate. An element included in the layer to be peeled is preferably not irradiated with light. FIG. 1D is a top view for showing this stage. FIG. 1C is a cross-sectional view of FIG. 1D taken along a solid line A-B.

As irradiating light, excimer laser is preferably used since the laser brings easily about ablation of the separating layer. When the separating layer is partly ablated, the irradiating laser light is preferably at a wavelength of from approximately 100 to 350 nm in the case that there is wavelength dependence. In the case of giving separation characteristics by causing phase change such as gas emission, vaporization, or sublimation to a part of the separation layer, the irradiating laser light is preferably at a wavelength of from approximately 350 to 1200 nm.

The irradiating excimer laser preferably has energy density of approximately from 100 to 500 mJ/cm$^2$. The irradiating time is preferably 10 to 100 nsec. In the present invention, ablation or the like is not especially required to be sufficiently produced, and so partial ablation may be produced to make gas (or liquid) containing fluorine halide pass (penetrate) easily into light irradiation region.

Needless to say, space may be formed by ablating completely the separating layer in a region irradiated with laser light. The formed space becomes a pathway for the gas (or liquid) containing fluorine halide, and the rest of the separating layer can be removed more efficiently. Even if the separating layer is completely ablated, the layer to be peeled 13 is fixed to the substrate 10 by the rest of the separating layer.

The layer to be peeled 13 is fixed by a first film 19a having a first adhesion layer 18a in order to prevent the layer to be peeled from dispersing. As a material for the first film 19a, a resin material (polyester, polypropylene, polyvinyl chloride, polystyrene, polyacrylonitrile, polyethylene terephthalate, nylon, or the like), typically, thermoplastic, a PVF (polyvinylfluoride) film, a mylar film, or a plastic substrate (having a thickness of from 200 to 500 μm) which is an acrylic resin film is used. The first film 19a preferably has a low thermal expansion property. Further, the layer to be peeled may be fixed by thermocompression with a laminate film. Here, an example of fixating the layer to be peeled by a first film after light irradiation is described; however, the process order is not especially limited. For example, the layer to be peeled may be fixed before light irradiation and light may be emitted through the film.

Figure 1E:
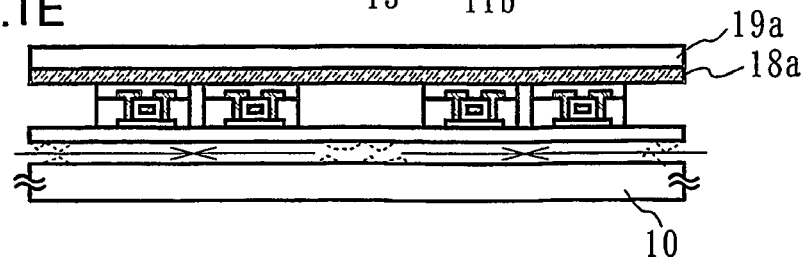

Then, the separating layer in a region other than the light irradiation region is removed to perform the second step in a peeling process (FIG. 1E). After the second step in the peeling process, the layer to be peeled 13 is peeled from the substrate 10. As an etching agent, chlorine trifluoride (ClF$_3$) is used. Simultaneously, not only the rest of the separating layer, but also the separating layer in the light irradiation region is removed.

The positions of a light irradiation region 11c and the layer to be peeled is preferably designed so that they are not overlapped with a part of the separating layer 11b in the position where the etching is terminated, that is, the separating layer 11b which is not etched to be left when etching the separating layer in the direction indicated by an arrow in FIG. 1E. Since cracks or the like tend to be generated at the position where etching is terminated, it is important that the position is not overlapped with the layer to be peeled which serves as a device afterwards. Here, the position where etching is terminated is interposed between two adjacent layers to be released.

The separation layer in the region irradiated with light in the previous process has holes or cracks by being ablated partly, and so the left the separating layer can be removed efficiently. That is, the region irradiated with laser light becomes a pathway for chloride trifluoride and the separation layer can be efficiently removed.

Figure 2A:
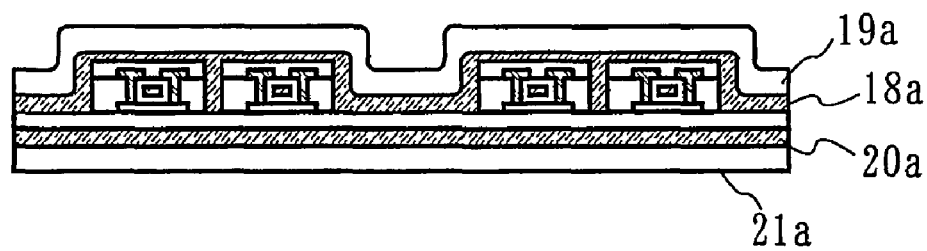
FIGS. 2A and 2B are explanatory views for showing a method for manufacturing a thin film integrated circuit in accordance with the present invention (Embodiment 1)

The layer to be peeled can be fixed by a second film 21a having a second adhesion layer 20a (refer to FIG. 2A). As the second film 21a, a resin material (polyester, polypropylene, polyvinyl chloride, polystyrene, polyacrylonitrile, polyethylene terephthalate, nylon, or the like), typically, thermoplastic, a PVF (polyvinylfluoride) film, a mylar film, or a plastic substrate (having a thickness of from 200 to 500 µm) which is an acrylic resin film is used. The second film 21a preferably has a low thermal expansion property.

Figure 2B:
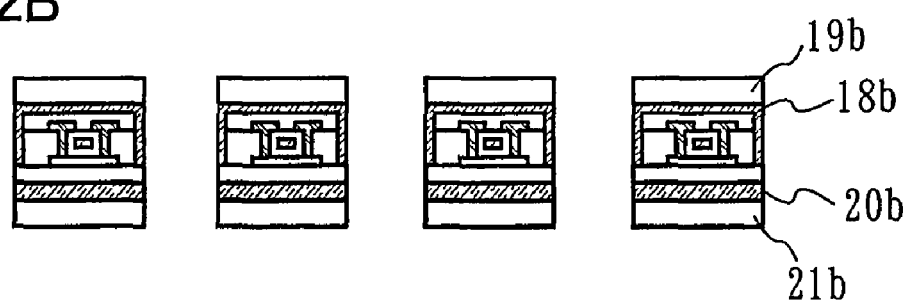

Lastly, the state shown in FIG. 2B can be obtained by dividing into pieces. The layer to be peeled 13 is sealed by the first film 19b having the first adhesion layer 18b and the second film 21b having the second adhesion layer 20b.

After forming an integrated circuit by a thin film over a large glass substrate, a peeling process is performed twice. Accordingly, a method for manufacturing large quantities of minute devices which can send and receive data in contact, preferably, out of contact by peeling an element from the substrate is provided. In accordance with the method described in this embodiment, laser light for ablation is not emitted to the element, and so element characteristics are not changed before and after performing the peeling process.

In the case that laser light is used for crystallization or activation of a semiconductor film in a manufacturing process for a semiconductor element included in the layer to be peeled, laser light is also emitted to a part of a separating layer located below, which allows an easy peeling process.

Here, an example that amorphous silicon is used as the separating layer, laser light is used as irradiating light for the separating layer, and chlorine trifluoride is used as an etching agent for etching the separating layer is explained; however, the present invention is not limited thereto. A person who implements the present invention may appropriately select these components.

Embodiment 2

A manufacturing method which is different from that described in Embodiment 1 is explained with reference to FIGS. 4A to 5B.

A separating layer 411a is formed over the whole surface of a substrate having an insulating surface 410. Here, a tungsten (W) film obtained by a sputtering method is used as the separating layer. Then, a base insulating layer 412a is formed by an inorganic insulating film (refer to FIG. 4A). As a material for the base insulating layer 412a, a material which hardly reacts or does not react chemically with gas or liquid containing fluorine halide used in the subsequent process is preferably used. The base insulating layer 412a is preferably formed by a laminated layer of silicon oxide film or a silicon nitride film. Here, a silicon nitride film is stacked over a silicon oxide film which is in contact with the tungsten film.

A layer to be peeled 413 using a base insulating film 412a as a base film is formed. The layer to be peeled including a first element group includes a first interlayer insulating layer 413a, a second interlayer insulating layer 413b, a plurality of TFTs 413c, and a conductive layer 413d serving as an antenna. Lastly, the layer to be peeled including the first element group becomes one device.

During the manufacturing process of a semiconductor element included in the layer to be peeled 413, a layer made from tungsten oxide (not shown) is formed at an interface between the separating layer and the base insulating layer. A layer made from tungsten oxide (not shown) is also formed at the interface when stacking the base insulating layer over the separating layer.

A protective layer 416 is formed by a screen printing method or a droplet discharging method. Here, the protective layer 416 is formed to cover both of the layer to be peeled including the first element group and a layer to be peeled including a second element group (refer to FIG. 4B). As a material for the protective layer 416, a material which does not react chemically with gas or liquid containing fluorine halide used in the subsequent process is preferably used. For example, organic resin such as epoxy resin may be used as the protective layer.

Figure 4A:
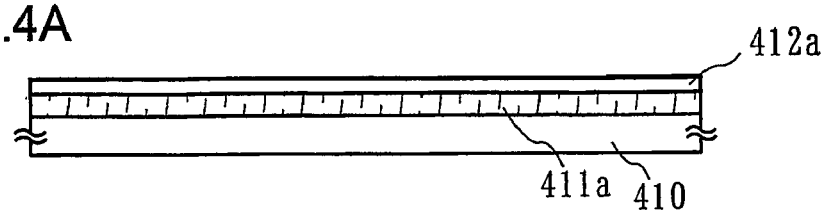
FIGS. 4A to 4F are explanatory cross-sectional views for showing a method for manufacturing a thin film integrated circuit in accordance with the present invention (Embodiment 2)
Figure 4B:
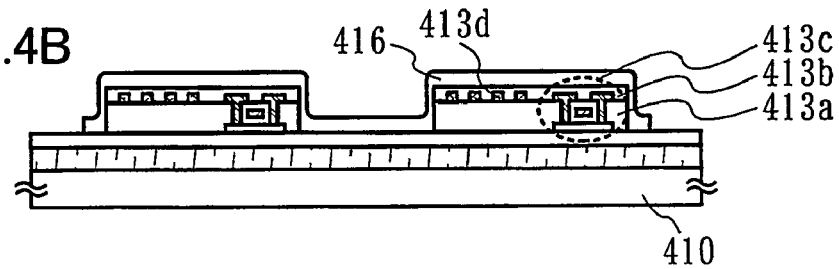
Figure 4C:
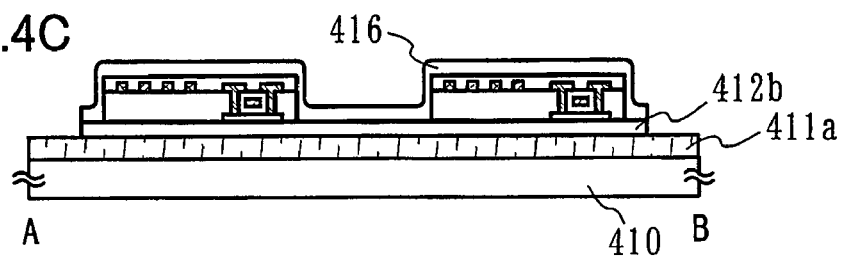

The base insulating layer 412a is selectively etched with the protective layer 416 as a mask to expose the separating layer 411a (refer to FIG. 4C).

Figure 5A:
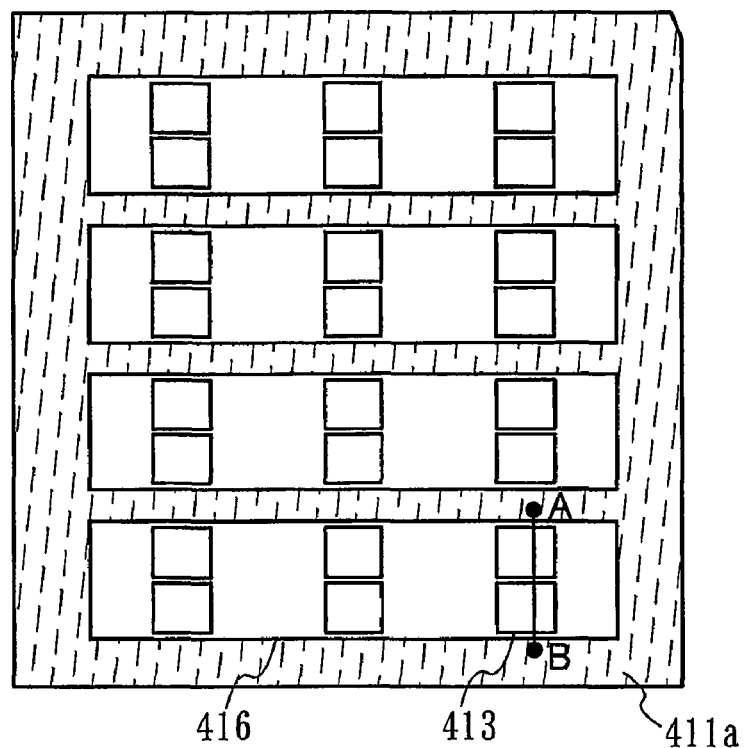
FIGS. 5A and 5B are top views for showing a method for manufacturing a thin film integrated circuit in accordance with the present invention (Embodiment 2)

FIG. 5A is a top view for showing this stage. FIG. 4C is a cross-sectional view of FIG. 5A taken along a solid line of A-B.

Figure 4D:
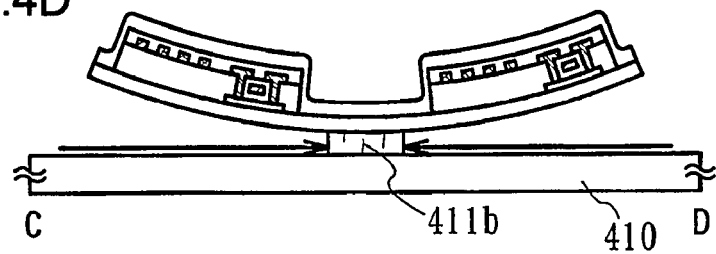

The first step in a peeling process is carried out by removing the separating layer with an etching agent. Here, the separating layer is not entirely removed. A part of the separating layer 411b is left by interrupting etching. The left separating layer 411b fixes the layer to be peeled. As an etching agent, chlorine fluoride ($ClF_3$) is used. FIG. 4D is a cross-sectional view for showing the state after etching. The etching is performed around the layer to be peeled. The layer to be peeled is arched to make the antenna be inside as preceding the etching.

The layer to be peeled and the protective layer are arranged so that one layer to be peeled is etched in one direction. The layer to be peeled is positioned so that the left separating layer 411b is not overlapped with the layer to be peeled.

Figure 5B:
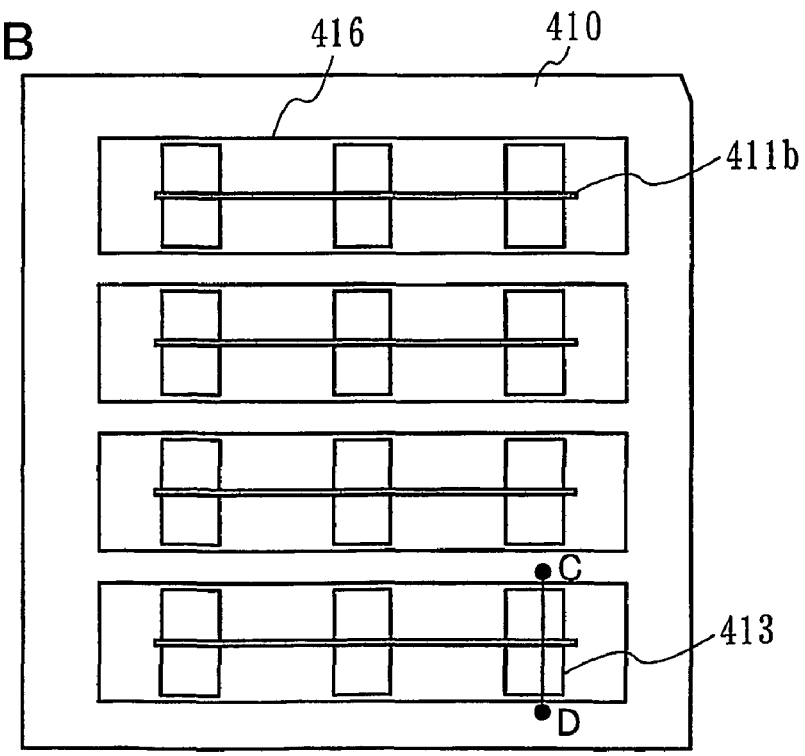

FIG. 5B is a top view for showing this stage. FIG. 4D is a cross-sectional view of FIG. 5B taken along a solid line of C-D.

After etching, the layer to be peeled is fixed by the left separating layer 411b in this embodiment. Even if the etching of the separating layer proceeds, the layer to be peeled is not arranged in a position where cracks tend to be produced.

Figure 4E:
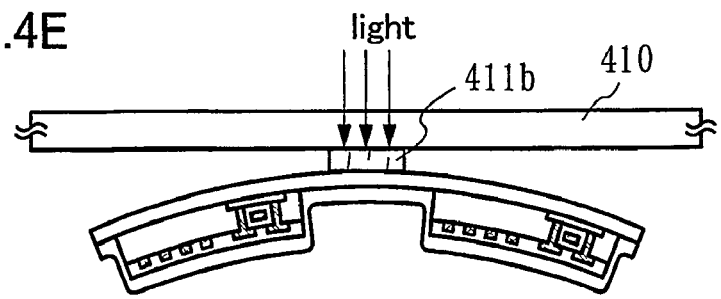

The second step in a peeling process is performed by emitting light to the left separating layer 411b. FIG. 4E shows the state that the substrate having an insulating surface 410 is kept upside down and light is emitted to the left separating layer 411b through the substrate having an insulating surface 410. The light irradiation deteriorates the adhesion between the separating layer 411b and the substrate having an insulating surface 410, subsequently, the layer to be peeled 413 is separated from the substrate having an insulating surface 410.

In the case that laser light is used as irradiating light, the layer to be peeled 413 can be separated one by one in an orderly manner starting from the portion which is subject to spot irradiation by laser scanning. The laser light may be emitted to only the left separating layer 411b and is not emitted to the portion provided with an element.

In the case that light from a light source such as halogen lamp is used as the irradiating light, the other portion which is intended to be irradiated (a portion provided with an element) is preferably covered by a metal mask or the like. Further, light from a light source such as halogen lamp is emitted to the whole surface, and so all layers to be released can be separated from the substrate simultaneously.

The layer to be peeled 413 which is separated is in free fall. In the case that the layer to be peeled 413 falls cover a plane surface, the layer to be peeled 413 is easily to be picked up since it is arched.

The layer to be peeled 413 which is picked up is fixed by a film having an adhesion layer 417. A film after uniaxial drawing 418 is used to fix the layer to be peeled 413 so as to keep the arched shape of the layer to be peeled 413. Since the film is sold in the state of being wound around a roll core, an adhesion surface is determined so as to be in contact with the base insulating layer 412b the inside surface of which is exposed.

The degree of an arch is preferably more than 0, 1% or more, and 20% or less against the width of a semiconductor device (the width in the direction perpendicular to the direction of an arch). In the case that the degree of the arch is more than 20%, there is a threat that problems are arisen that the layer to be peeled is practically difficult to be pasted onto a product and that data is difficult to be read by a reading out device. The degree of the arch is preferably controlled so that the layer to be peeled is not arched reversely due to change in temperature.

Figure 3A:
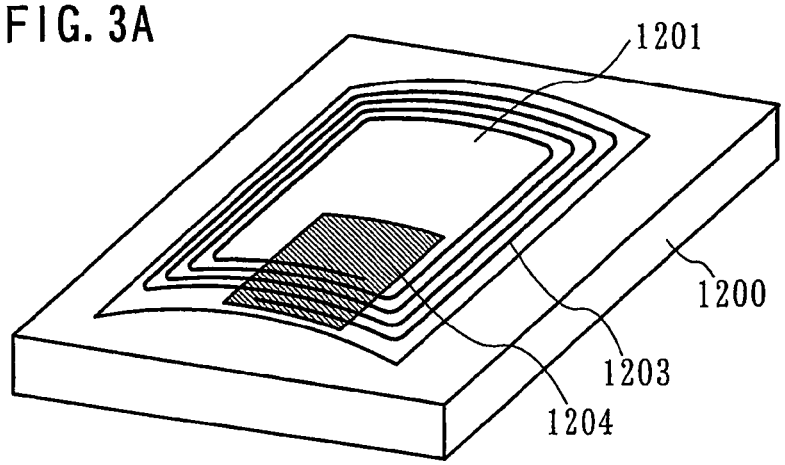
FIGS. 3A to 3C are perspective views for showing a thin film integrated circuit in accordance with the present invention and a view for showing the definition of a degree of an arch of the thin film integrated circuit.
Figure 3B:
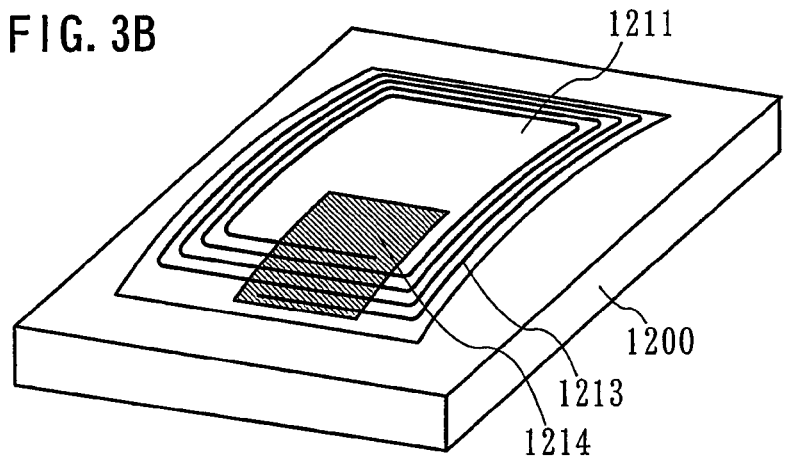
Figure 3C:
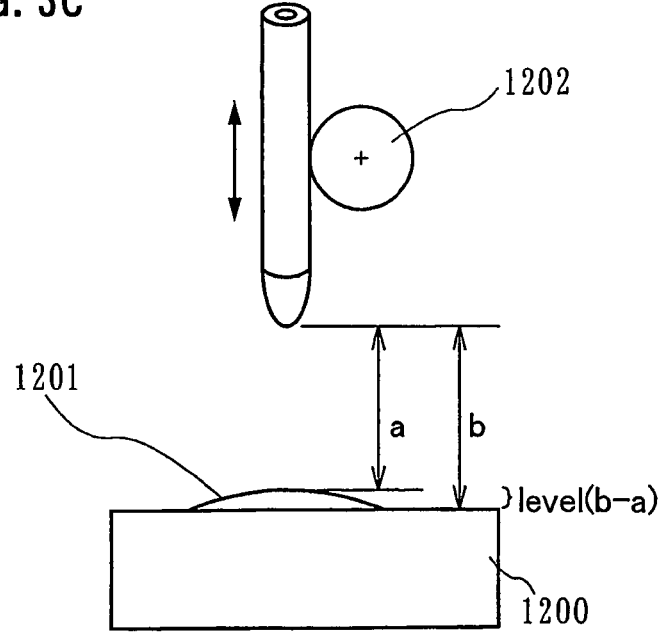

The degree of the arch is indicated by a level obtained by using a means for focusing 1202 illustrated in FIG. 3C. FIG. 3A shows an example of a semiconductor device mounted over a plane surface of a measurement mold platen 1200. The semiconductor device illustrated in FIG. 3A has been arched since it is in an initial state and has an antenna unit 1203 and an integrated circuit portion including a TFT. FIG. 3B shows an example in which the direction of an arch is different by 90° from that in the example shown in FIG. 3A. The semiconductor device shown in FIG. 3B has been an arching device since it is in an initial state and has an antenna unit 1213 and an integrated circuit portion including a TFT 1214. This embodiment can adopt either form depending on a layout.

Figure 4F:
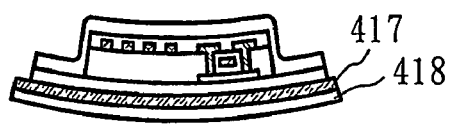

Lastly, the state shown in FIG. 4F can be obtained by performing a dividing process. By forming a device to have an arching shape since it is in an initial state, it becomes clear which surface of the device is an obverse side or a reverse side. In the case that the device is made to be arched in the direction opposite to that in the initial state, the surface which is fragile can become easy to know. By arching the initial state of the semiconductor device, an extremely thin device on a plane surface can become easy to be picked up. Further, FIG. 4F shows that the direction in which the device is arched and the channel direction of the TFT 413c are conformed to each other; however, very small TFTs are not arched but a portion of the device where the TFTs are not provided is arched in the case that the degree of an arch is small. There is a threat that the TFTs are arched in the case that the degree of an arch is large or the sizes of the TFTs are large, accordingly, the direction in which the device is arched and the channel direction of the TFT are preferably different from each other.

Figure 11:
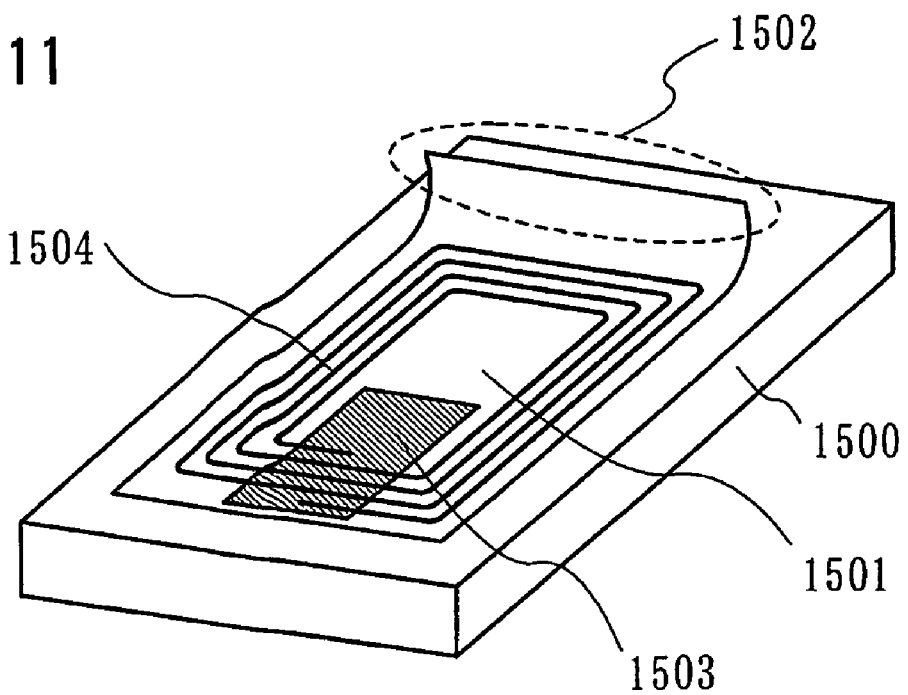
FIG. 11 is a perspective view for showing an example of a device in accordance with the present invention.

FIG. 11 illustrates an example of a device which is partly arched. In the device shown in FIG. 11, a portion which is not provided with an antenna unit 1504 and an integrated circuit unit 1503 is arched. Since the portion which is arched is plane, a device 1501 can be easily mounted to an article having a plane surface 1500. Further, an arched portion 1502 can be made to be easily picked up in the case that the device 1501 is mounted to a product or the like and detached from the product for some reasons.

By making at least a part of the device be arched, an obverse side or a reverse side of the device 1501 can be determined. Since the device 1501 is thin, the device 1501 can be read in either case that the device is faced up or reversed, that is, the device 1501 can be read in either case that the reading out device is provided at the side of a layer including an antenna of the device 1501 or at an opposite side thereto.

An example of fixing the layer to be peeled 413 by one film is explained in this embodiment; however, two films can also be used to interpose the layer to be peeled 413 to fix it. For example, the layer to be peeled 413 may be interposed by two films which are adjusted their drawing directions (films after uniaxial drawing) to be fixed. Alternatively, the layer to be peeled 413 may be arched by being interposed by a plurality of films having different thermal expansion coefficients.

The layer to be peeled 413 may be interposed by a first film and a second film. The thermal shrinkage of the first film provided at the side of a layer including an antenna may be smaller than that of the second film provided at the side of a layer including a thin film transistor.

Further, at least a part of the device can be arched by arching a laminate film when performing a laminate process.

An amorphous silicon film can be used instead of a tungsten film which is used as the separating layer in this embodiment. The amorphous silicon film can also be removed by gas or liquid containing fluorine halide. The amorphous silicon film can produce ablation by laser light. In the case that the amorphous silicon film is used as the separating layer, therefore, the layer to be peeled may be separated from the substrate by performing the first peeling process which removes a part of the separating layer by gas or liquid containing fluorine halide and the second peeling process which emits laser light to the left separating layer.

Further, a silicon oxide film can be used instead of a tungsten film which is used as the separating layer. In the case that a silicon oxide film is used as the separating layer, the layer to be peeled may be separated from the substrate by performing the first peeling process which removes a part of the separating layer by fluorinated acid (HF) and the second peeling process which deteriorates adhesion between the separating layer and the substrate by emitting laser light to the left separating layer. In the case of using fluorinated acid (HF), a part of a glass substrate is melted and the layer to be peeled is preferably protected by being covered by resin.

Embodiment 3

An example of manufacturing apparatus for a thin film integrated circuit is explained in this embodiment.

Figure 6A:
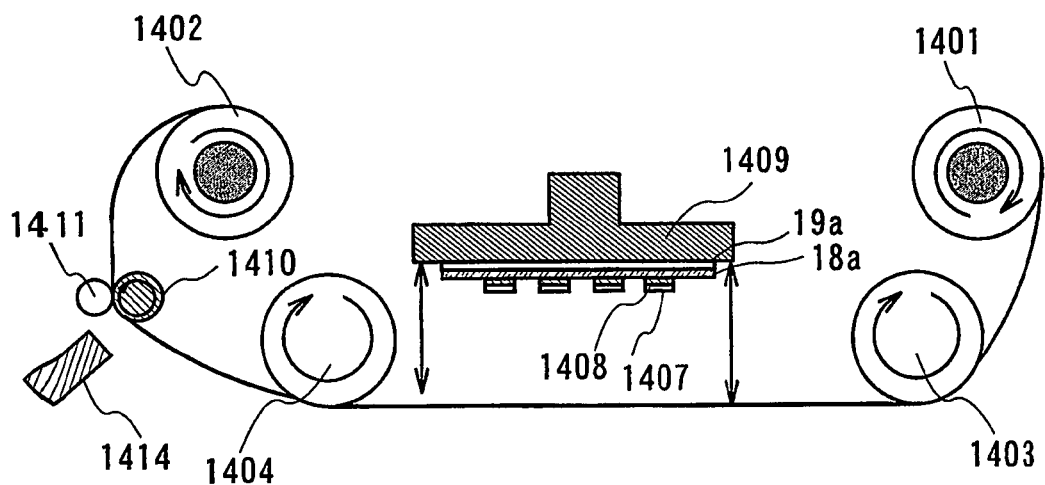
FIGS. 6A and 6B are views for showing a device for manufacturing a thin film integrated circuit.

FIG. 6A shows manufacturing apparatus which arches the device by means of laminating in accordance with Embodiment 1.

The manufacturing apparatus shown in FIG. 6A has a delivery roller for a film 1401, a take-up roller for a film 1402, transporting rollers 1403, 1404, a substrate carrier arm 1409, and rollers 1410, 1411.

In accordance with Embodiment 1, the state shown in FIG. 1E is obtained, and a first film 19a is held by the substrate carrier arm 1409 with a vacuum chuck. Like components are denoted by like numerals as of Embodiment 1. The first film 19a is provided with a first adhesion layer 18a. A layer including an antenna 1408 is adhered to a layer including a TFT 1407 by the first adhesion layer 18a.

The first film 19a is simply mounted over the laminate film by lightly pressing the first film 19a at the laminated film which is delivered from the delivery roller for a film 1401. After pressing, the first film 19a is released by turning off the vacuum chuck.

The film mounted with the first film 19a is transported by the transporting roller 1404 and laminated by the roller 1410 for heating and the roller 1411. The roller 1410 for heating is arranged at the side of the layer including a TFT 1407 to arch the laminated thin film integrated circuit. The alignment of the lamination is controlled by an alignment device 1414 such as a CCD camera to perform lamination. The thin film integrated circuit is a device composed of a laminate layer of the layer including an antenna 1408 and the layer including a TFT 1407. The antenna is electrically connected to the TFT.

Thereafter, the thin film integrated circuit which is arched to make the layer including an antenna be inside is wound around the take-up roller 1402.

By the foregoing process, the device in accordance with Embodiment 1 can be arched by lamination. In the manufacturing apparatus shown in FIG. 6A, laminate films are transported while assuming the definite direction of an arch.

Figure 6B:
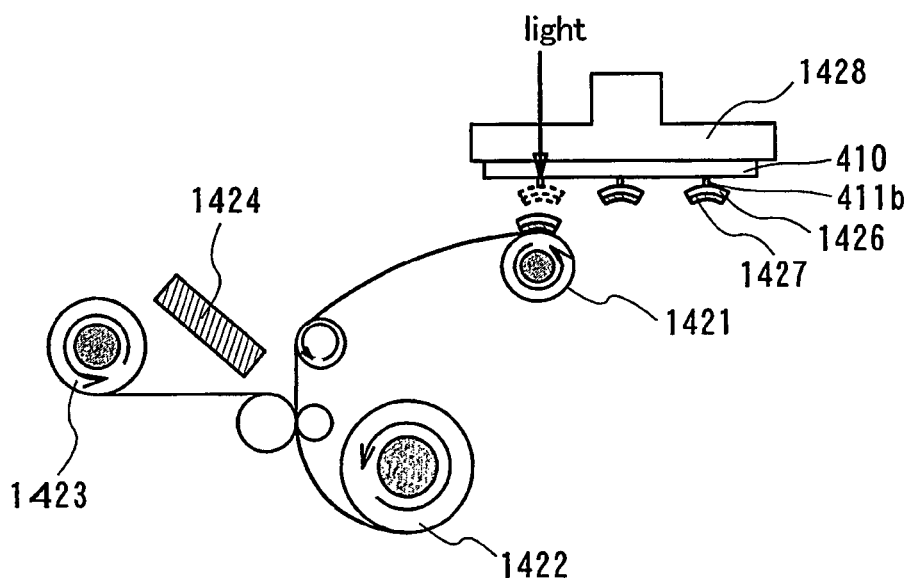

FIG. 6B shows manufacturing apparatus for laminating and protecting a device which has been arched since it is in an initial state in accordance with Embodiment 2.

Manufacturing apparatus shown in FIG. 6B has a delivery roller for a film 1421, a take-up roller for a film 1422, a plurality of transporting rollers, a substrate carrier arm 1428, a delivery roller for a film 1423, and a lamination roller.

After obtaining the state shown in FIG. 4D in accordance with Embodiment 2, a substrate having an insulating surface 410 is upside down to be held by the substrate carrier arm 1428 having a quartz window. A thin film integrated circuit is fixed to the substrate having an insulating surface 410 by a left separating layer 411b. The thin film integrated circuit is a device composed of a laminate layer of the layer including an antenna 1427 and the layer including a TFT 1426. The antenna is electrically connected to the TFT.

As shown in FIG. 6B, light is emitted to the left separating layer 411b through the substrate having an insulating surface 410. Accordingly, the thin film integrated circuit composed of a laminate layer of the layer including an antenna 1427 and the layer including a TFT 1426 is separated to be mounted on the delivery roller for a film 1421. It is preferable that a roll diameter is appropriately set so that the arch of the thin film integrated circuit and the delivery roller for a film 1421 coincide with each other.

A film delivered from the delivery roller for a film 1421 has an adhesion layer at its outer surface and is transported while being mounted with the adhered thin film integrated circuit. The film is laminated by a lamination film delivered from another delivery roller for a film 1423 to be wound around the take-up roller 1422.

If necessary, alignment of the lamination is controlled by an alignment device 1424 such as a CCD camera.

In accordance with the foregoing process, the device in accordance with Embodiment 2 can be laminated while keeping an arch shape. The manufacturing apparatus shown in FIG. 6B has the mechanism that the device is not arched in the direction opposite to that in the initial state. The laminate films are transported while assuming the definite direction of an arch.

This embodiment can be freely combined to Embodiment 1 or 2.

Embodiment 4

This embodiment shows an example of a method for manufacturing a thin film integrated circuit.

A layer to be peeled including a semiconductor integrated circuit (here, CPU) and a terminal electrode (not shown) is formed over a first electrode.

A separating layer, here, a tungsten film, having a thickness of from 10 to 200 nm, preferably, 30 to 75 nm is formed over a substrate by a sputtering method. Then, an oxide layer, here, a silicon oxide film, having a thickness of from 150 to 200 nm is stacked thereover without exposing to the air. The thickness of the oxide film is desirably more than twice as large as that of the separating layer. When stacking the layers, an amorphous metal oxide film (tungsten oxide film) with a thickness of from approximately 2 to 5 nm is formed between the separating layer and a silicon oxide film.

Since a film is deposited over the edge of a substrate in the case of using a sputtering method, the tungsten film, the tungsten oxide film, and a silicon oxide film deposited over the edge of the substrate are preferably removed selectively by $O_2$ ashing.

Then, a silicon oxynitride film (with a thickness of 100 nm) (not shown) is formed by a PCVD method as a base insulating film. And then, an amorphous silicon film containing hydrogen (with a thickness of 100 nm) is stacked thereover without exposing to the air.

The foregoing amorphous silicon film is crystallized by a known technique (a solid phase growth method, a laser crystallization method, a crystallization method using metal catalysts, or the like) to form an element using a TFT having a polysilicon film as an active layer. Here, the polysilicon film is obtained by the crystallization method using metal catalysts. Nickel acetate solution containing nickel of 10 ppm in weight is coated by a spinner. Instead of coating, a nickel element can be sprayed by a sputtering method over a whole surface. Then, heat treatment is carried out to crystallize the film to form a semiconductor film (here, a polysilicon layer) having a crystalline structure. Here, the silicon film having a crystalline structure is obtained by performing heat treatment (500° C. for 1 hour) and heat treatment for crystallization (550° C. for 4 hours).

As another crystallization method, a method that a metal element which is to be a catalyst is doped to the amorphous silicon film to obtain a polysilicon film by heat treatment and pulsed oscillation laser light is emitted to the polysilicon film; a method that continuous oscillation laser light is emitted to the amorphous silicon film to obtain a polysilicon film; a method that the amorphous silicon film is heated to obtain a polysilicon film and continuous oscillation laser light is emitted to the polysilicon film; or a method that a metal element which is to be a catalyst is doped to the amorphous silicon film, heat treatment is carried out to obtain a polysilicon film, and continuous oscillation laser light is emitted to the polysilicon film may be used.

The amorphous silicon film contains hydrogen. When heat treatment at approximately 410° C. or more for crystallization is carried out in the case that a polysilicon film is formed by heat treatment, hydrogen can be diffused simultaneously with forming the polysilicon film. By performing heat treatment at 410° C. or more, an amorphous metal oxide film is crystallized and a metal oxide film having a crystalline structure can be obtained. By performing heat treatment at 410° C. or more, a metal oxide film having a crystalline structure can be obtained and hydrogen can be diffused.

After removing an oxide film over the silicon film having a crystalline structure by rare fluorinated acid or the like, irradiation of laser light (XeCl: wavelength at 308 nm) is performed to increase a crystallization rate and to repair defects left in a crystal grain in the air or oxygen atmosphere.

In addition to the oxide film formed by irradiation of laser light, a barrier layer formed by an oxide film having a total thickness of from 1 to 5 nm by treating 120 seconds with ozone water. The barrier layer is formed to remove the nickel which is doped to crystallize the amorphous silicon film. The oxide film formed by irradiation of laser light can be removed before forming the barrier film.

An amorphous silicon film containing an argon element which is to be a gettering site is formed to have a thickness of from 10 to 400 nm, here, 100 nm, over the barrier film by a sputtering method or a PCVD method.

Thereafter, heat treatment for 3 minutes in an oven heated to 650° C. and gettering are performed to decrease nickel density in the semiconductor film having a crystalline structure. Instead of the oven, a lamp annealing device can be used.

The amorphous silicon film containing an argon element which is a gettering site is selectively removed by using the barrier layer as an etching stopper, and the barrier layer is selectively removed by rare fluorinated acid. The barrier layer formed by an oxide film is desirably removed after the gettering, since the nickel tends to move to a region having high oxygen density when gettering.

In the case that crystallization using a catalyst element is not performed, the foregoing processes, that is, formation of a barrier layer, formation of a gettering site, heat treatment for gettering, removal of a gettering site, removal of a barrier layer, and the like are unnecessary.

A thin oxide film is formed by ozone water over the surface of the obtained silicon film having a crystalline structure (also referred to as a polysilicon film), and a mask is formed by resist to form semiconductor layers separated into islands by etching into desired shapes. After forming the semiconductor layers, the mask formed by resist is removed.

After forming a gate insulting film for covering the semiconductor layers, a gate electrode is formed over the gate insulating film. Then, a top gate TFT using a polysilicon film as an active layer is manufactured by appropriately performing the processes as follows, that is, formation of a source region or a drain region by doping to the active layer, formation of an interlayer insulating film (inorganic insulating film), formation of a source electrode or a drain electrode, activation treatment, hydrogenation treatment, and the like. In addition, an n-channel TFT can be formed in the case of doping phosphorus imparting an n-type as an impurity element for doping, whereas a p-channel TFT can be formed in the case of doping boron imparting a p-type. A CMOS circuit can be manufactured by combining these TFTs.

An example of a top gate TFT is described as a structure of a TFT; however, the structure of a TFT is not limited. For example, a bottom gate type or a forward staggered type can be adopted.

Various elements as typified by a TFT (a thin film diode, a photoelectric transducer formed by a PIN junction of silicon, a silicon resistance element, or a sensor element (typically, a pressure-sensitive fingerprint sensor using polysilicon)) can be formed.

As noted above, a layer to be peeled including a circuit having an element is formed.

In the subsequent process, the layer to be peeled is separated from a substrate by performing a first peeling process for removing a part of a separating layer and a second peeling process for emitting layer light to the separating layer which is left in accordance with Embodiment 2.

In the case that an amorphous film is used as the separating layer instead of the tungsten film, the layer to be peeled is separated from a substrate by performing a first peeling process for emitting selectively laser light and a second peeling process for removing the separating layer by etching by means of a portion ablated by irradiation.

This embodiment can be freely combined with Embodiment 1, 2, or 3.

Embodiment 5

The thin film integrated circuit manufactured in accordance with the present invention has a plurality of elements and a conductive layer serving as an antenna. A plurality of the elements is, for example, a thin film transistor, a capacitive element, a resistive element, a diode, or the like.

Figure 7:
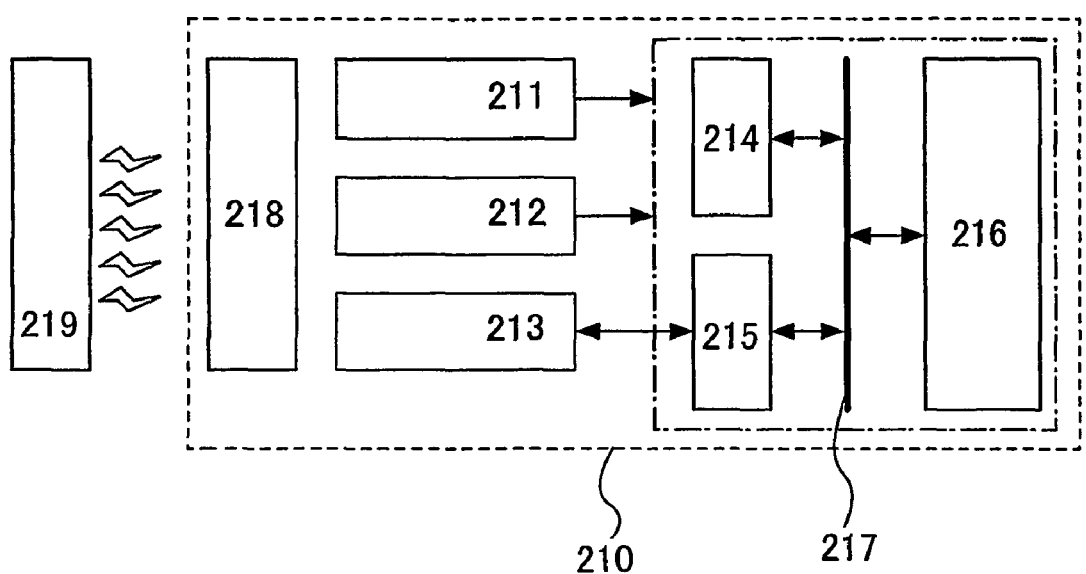
FIG. 7 is an explanatory block diagram for showing a thin film integrated circuit.

A thin film integrated circuit 210 has a function of transmitting data out of contact. A plurality of elements included in the thin film integrated circuit 210 constructs various circuits. The thin film integrated circuit 210 has a power source circuit 211, a clock generation circuit 212, a data modulation/demodulation circuit 213, a control circuit 214, an interface circuit 215, a memory 216, a data bus 217, an antenna (also referred to as an antenna coil) 218, and the like (refer to FIG. 7).

The power source circuit 211 is a circuit for generating various power sources to be supplied to the foregoing each circuit based on an alternating signal which is input from the antenna 218. The clock generation circuit 212 is a circuit for generating various clocks to be supplied to the foregoing each circuit based on an alternating signal which is input from the antenna 218. The data modulation/demodulation circuit 213 has a function of demodulating/modulating data transmitted with a reader/writer 219. The control circuit 214 corresponds to a central processing unit (CPU), a microprocessor unit (MPU), or the like and has a function of sending and receiving an electromagnetic field or an electronic wave. The reader/writer 219 communicates with the thin film integrated circuit, controls the transmission, and controls processing relating to the data.

The circuit constructed by the thin film integrated circuit is not limited to have the foregoing structure. For example, the circuit may be a structure added with other components such as a limiter circuit of power source voltage or cryptographic processing hardware.

This embodiment can be freely combined with Embodiment 1, 2, 3, or 4.

Embodiment 6

Figure 8A:
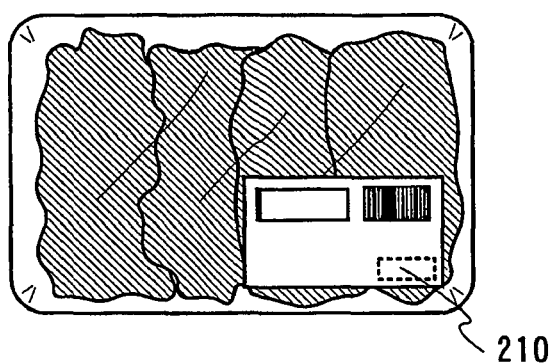
FIGS. 8A to 8D are explanatory views for showing type of usage of a thin film integrated circuit.
Figure 8B:
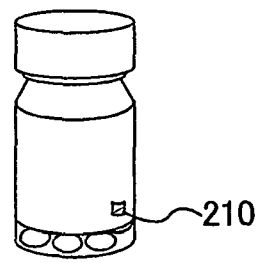
Figure 8C:
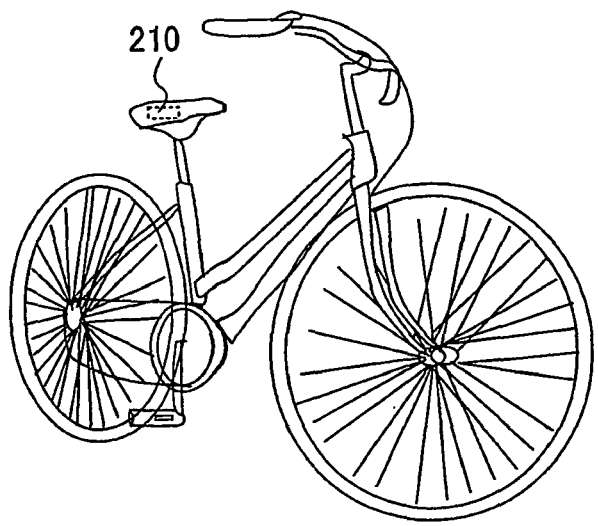
Figure 8D:
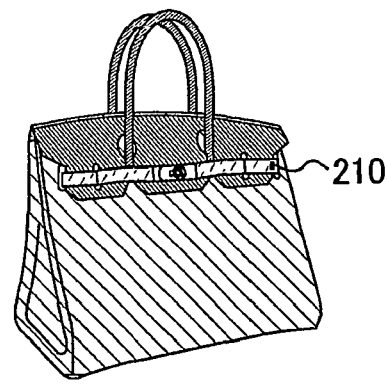

The thin film integrated circuit in accordance with the present invention is versatile. For example, the thin film integrated circuit can be mounted to foods (labels or the like, refer to FIG. 8A), packing containers (wrapping papers, bottles, or the like, refer to FIG. 8B), vehicles (cars, or the like, refer to FIG. 8C), commodities (bags, glasses, or the like, refer to FIG. 8D), garments, consumption goods, electric appliances, or the like. The electric appliance indicates a liquid crystal display device, an EL display device, a television apparatus (referred to as a television or television set), a cellular phone, and the like.

The thin film integrated circuit which is obtained by the present invention is arched in its initial state. Therefore, the thin film integrated circuit is preferably provided to various kinds of product depending on the arch shape, typically, a curved surface. Since the thin film integrated circuit has an arching shape since it is in an initial state, it becomes clear which surface of the thin film integrated circuit is an obverse side or a reverse side. Accordingly, a mistake of pasting the thin film integrated circuit onto a product can be reduced.

The thin film integrated circuit can be fixed to an article by pasting onto the surface of the article or embedding in the article. In the case of a package made from organic resin, the thin film integrated circuit may be embedded in the organic resin of the package. An inspection system or a system used in a rental shop can be made more efficient by providing the thin film integrated circuit to packing containers, recording media, commodities, foods, garments, consumption goods, electric appliances, and the like. Imitation or theft can be prevented by providing the thin film integrated circuit to vehicles.

Figure 9A:
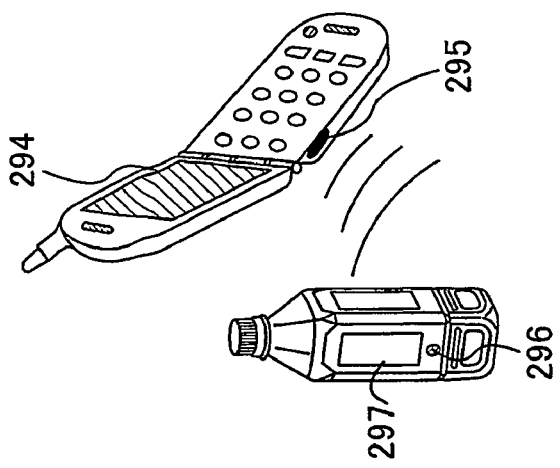
FIGS. 9A and 9B are explanatory views for showing type of usage of a thin film integrated circuit.
Figure 9B:
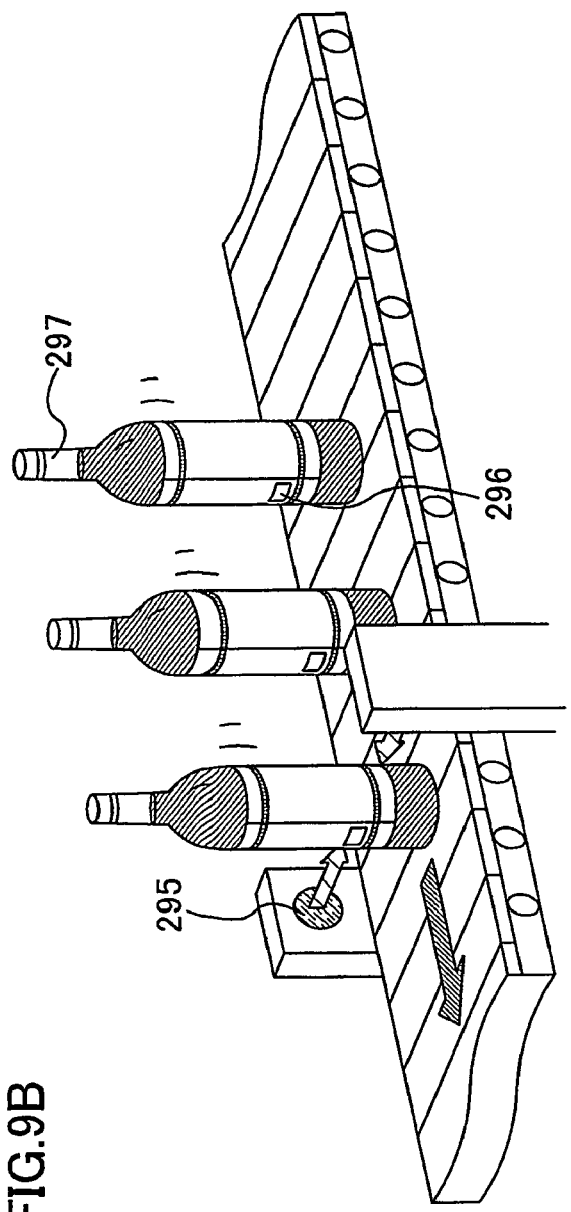
Figure 10A:
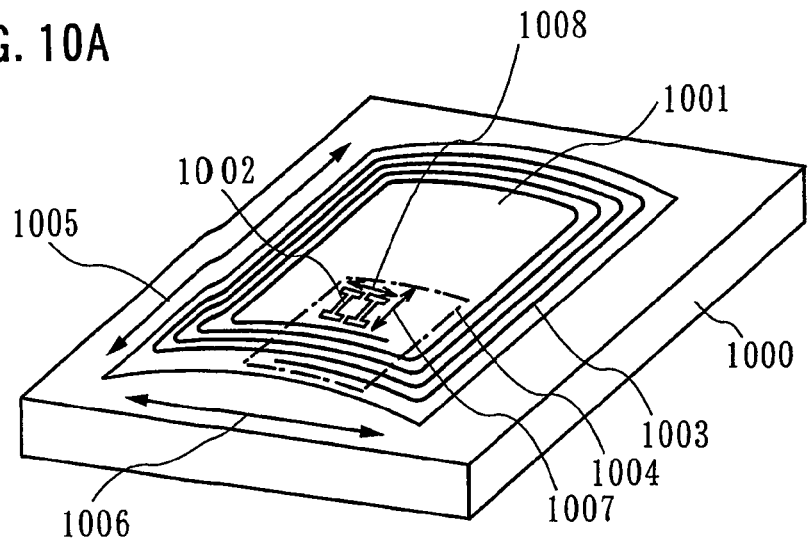
FIGS. 10A to 10D are a perspective view for showing an example of a device in accordance with the present invention, a cross-sectional view of FIG. 10A, a perspective view for showing another example of the device in accordance with the present invention; and a cross-sectional view of FIG. 10C, respectively.
Figure 10B:
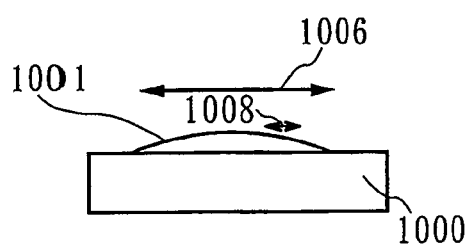
Figure 10C:
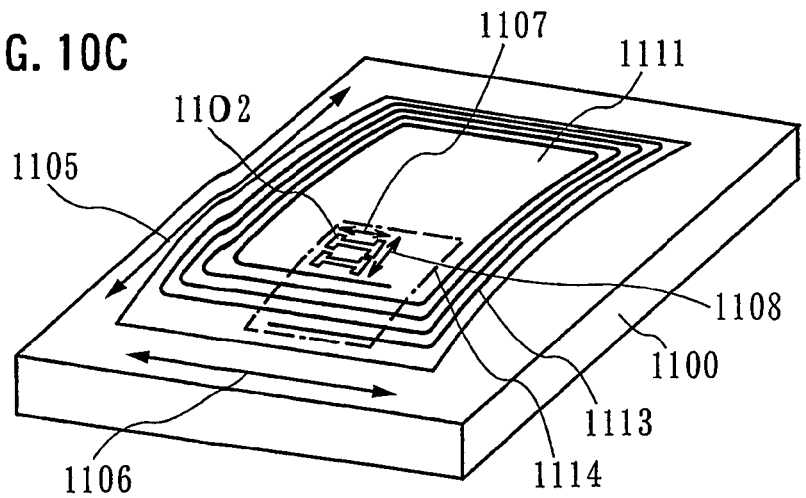
Figure 10D:
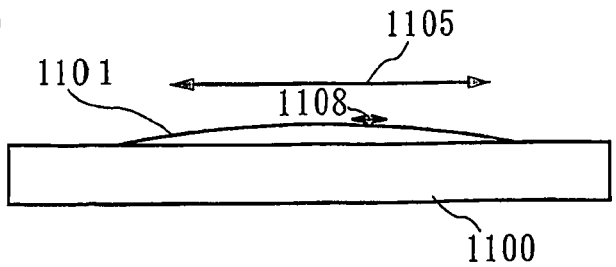

By applying the thin film integrated circuit to a system for management or distribution of goods, the system can be made sophisticated. For example, the case that a reader/writer 295 is provided to the side face of a portable terminal having a display portion 294 and the case that a thin film integrated circuit 296 is provided to the side face having a curved surface of an article 297 (FIG. 9A) are taken as an example. In that case, when the thin film integrated circuit 296 is held over the reader/writer 295, information on the raw material, the place of origin, and the history of a distribution process of the article 297 is displayed on the display portion 294. As another example, the case that the reader/writer 295 is provided beside a belt conveyor can be nominated (refer to FIG. 9B), in that case, inspection of the article 297 can be easily carried out.

This embodiment can be freely combined with Embodiment 1, 2, 3, 4, or 5.

INDUSTRIAL APPLICABILITY

A peeling process can be performed in multiple processes in accordance with the present invention, and so mass-production can be efficiently carried out even if using a large substrate. By performing the peeling process in multiple processes, a manufacturing line which carries out intermittent transportation for predetermined takt time can be constructed. In addition, time of the entire process for manufacturing a semiconductor can be reduced.

The invention claimed is:

1. A method for manufacturing a semiconductor device comprising the steps of:
   forming a separating layer over a first substrate;
   forming a layer to be peeled including a semiconductor element over the separating layer;
   forming a space within a part of the separating layer by emitting light to a part of the separating layer;
   separating the layer to be peeled from the first substrate by removing the separating layer by introducing a gas or a liquid into the space which dissolves the separating layer from the space; and
   fixing the layer to be peeled to an adhesion surface of a second substrate.

2. A method for manufacturing a semiconductor device comprising the steps of:
   forming a separating layer over a first substrate;
   forming a layer to be peeled including a semiconductor element over the separating layer;
   performing ablation in a part of the separating layer by emitting light to the part of the separating layer;
   separating the layer to be peeled from the first substrate by removing the separating layer by introducing a gas or a liquid which dissolves the separating layer from the part of the separating layer which is ablated; and
   fixing the layer to be peeled to an adhesion surface of a second substrate.

3. A method for manufacturing a semiconductor device comprising the steps of:
   forming a separating layer over a first substrate;
   forming a layer to be peeled including a semiconductor element over the separating layer;
   forming a space within a part of the separating layer by emitting light to a periphery of the semiconductor element;
   introducing a gas or a liquid into the space which dissolves the separating layer from the space;
   peeling the layer to be peeled from the first substrate which are fixed to each other by a part of the separating layer overlapped with the semiconductor element; and
   fixing the layer to be peeled to an adhesion surface of a second substrate.

4. A method for manufacturing a semiconductor device comprising the steps of:
   forming a separating layer over a first substrate;
   forming a layer to be peeled including a semiconductor element over the separating layer;
   forming a space at an interface between the separating layer and the layer to be peeled by emitting light to a part of the separating layer;
   separating the layer to be peeled from the first substrate by removing the separating layer by introducing a gas or a liquid into the space which dissolves the separating layer from the space; and
   fixing the layer to be peeled to an adhesion surface of a second substrate.

5. A method for manufacturing a semiconductor device comprising the steps of:
   forming a separating layer over a first substrate;
   forming a layer to be peeled including a semiconductor element over the separating layer;
   forming a space at an interface between the separating layer and the layer to be peeled by emitting light to a periphery of the semiconductor element;
   introducing a gas or a liquid into the space which dissolves the separating layer from the space;
   peeling the layer to be peeled from the first substrate which are fixed to each other by a part of the separating layer overlapped with the semiconductor element; and
   fixing the layer to be peeled to an adhesion surface of a second substrate.

6. The method for manufacturing a semiconductor device according to claim 3 or 5, wherein the separating layer is formed by a film containing $WO_X$ over W, a film containing $MoO_X$ over Mo, a film containing $NbO_X$ over Nb, or a film containing $TiO_X$ over Ti.

7. The method for manufacturing a semiconductor device according to claim 3 or 5, wherein the separating layer is a semiconductor layer having an amorphous structure, ceramics, a metal material composed of tungsten, molybdenum, niobium, or titanium, or an organic polymer material.

8. The method for manufacturing a semiconductor device according to claim 6, wherein the light is a laser light which uses any one of YAG laser, $YVO_4$ laser, $GdVO_4$ laser, YLF laser, or Ar laser and the light makes the separating layer generate gas when the light is emitted to the separating layer.

9. The method for manufacturing a semiconductor device according to claim 6, wherein the light is a laser light which uses any one of YAG laser, $YVO_4$ laser, $GdVO_4$ laser, YLF laser, or Ar laser and the light makes bonding force between atoms or molecules of a substance for constructing the separating layer vanish or decrease when the light is emitted to the separating layer.

10. The method for manufacturing a semiconductor device according to claim 6, wherein the light is a laser light at a wavelength of from 100 to 350 nm.

11. The method for manufacturing a semiconductor device according to claim 6, wherein the light is a laser light at a wavelength of from 350 to 1200 nm.

12. The method for manufacturing a semiconductor device according to claim 6, wherein the gas or the liquid which dissolves the separating layer is gas or liquid containing fluorine halide.

* * * * *